(12) United States Patent
Takahashi et al.

(10) Patent No.: US 9,171,987 B2
(45) Date of Patent: *Oct. 27, 2015

(54) RADIOACTIVE RAY DETECTOR AND RADIOACTIVE RAY DETECTING APPARATUS

(75) Inventors: Isao Takahashi, Hitachi (JP); Yoshinori Sunaga, Hitachinaka (JP); Hidetaka Kawauchi, Hitachi (JP)

(73) Assignee: Hitachi Aloka Medical, Ltd., Tokyo (JP)

( * ) Notice: Subject to any disclaimer, the term of this patent is extended or adjusted under 35 U.S.C. 154(b) by 248 days.

This patent is subject to a terminal disclaimer.

(21) Appl. No.: 13/813,335

(22) PCT Filed: Aug. 1, 2011

(86) PCT No.: PCT/JP2011/067586
§ 371 (c)(1),
(2), (4) Date: Jun. 6, 2013

(87) PCT Pub. No.: WO2012/017981
PCT Pub. Date: Feb. 9, 2012

(65) Prior Publication Data
US 2013/0249030 A1 Sep. 26, 2013

(30) Foreign Application Priority Data
Aug. 4, 2010 (JP) .................................. 2010-175382

(51) Int. Cl.
*H01L 31/118* (2006.01)
*G01T 1/24* (2006.01)
(52) U.S. Cl.
CPC .............. *H01L 31/118* (2013.01); *G01T 1/241* (2013.01); *G01T 1/243* (2013.01)

(58) Field of Classification Search
CPC ........ H01L 31/118; G01T 1/243; G01T 1/241
See application file for complete search history.

(56) References Cited

U.S. PATENT DOCUMENTS 7,507,971 B2 3/2009 Shibayama et al.
2008/0173823 A1 7/2008 Okada
(Continued)

FOREIGN PATENT DOCUMENTS

CN 1774809 A 5/2006
CN 101004527 A 7/2007
(Continued)

*Primary Examiner* — Fernando L Toledo
*Assistant Examiner* — Valerie N Newton
(74) *Attorney, Agent, or Firm* — Volpe and Koenig, P.C.

(57) ABSTRACT

An object of the present invention is to provide a radioactive ray detector for enabling to reduce the parasitic capacity lower than that of the conventional art, which is generated between the semiconductor elements of the radioactive ray detectors neighboring with, and a radioactive ray detecting apparatus applying that therein. The radioactive ray detector, comprises a substrate, a first semiconductor element and a second semiconductor element, which are provided to face to each other with positioning the substrate therebetween, a first electrode pattern, which is electrically connected with the first semiconductor element on a surface facing to an opposite side of the substrate, and a second electrode pattern, which is electrically connected with the second semiconductor element on a surface facing to an opposite side of the substrate, wherein the first electrode pattern and the second electrode pattern are arranged not to overlap with each other, when seeing through the substrate in a direction of thickness thereof.

10 Claims, 7 Drawing Sheets (56) References Cited

U.S. PATENT DOCUMENTS

2009/0321652 A1* 12/2009 Motomura et al. ........... 250/374
2010/0200764 A1* 8/2010 Yu et al. ................... 250/370.13
2010/0308230 A1 12/2010 Yanagita et al.
2013/0248726 A1* 9/2013 Kawauchi et al. ....... 250/370.01

FOREIGN PATENT DOCUMENTS

| JP | 2008-098391 A | 4/2008 |
| JP | 2009-074817 A | 4/2009 |
| JP | 2009-198343 A | 9/2009 |

* cited by examiner

RADIOACTIVE RAY DETECTOR AND RADIOACTIVE RAY DETECTING APPARATUS

TECHNICAL FIELD

The present invention relates to a radioactive ray detector and a radioactive ray detecting apparatus applying that therein.

BACKGROUND OF THE INVENTION

As a conventional radioactive ray detector module is disclosed, for example, in the following the Patent Document 1, a semiconductor detector module, having semiconductor elements for generating signal inductive charges upon receipt of radioactive rays thereon, and a pair of electrodes, being provided so as to put said semiconductor element therebetween, thereby obtaining a data signal due to an incidence of the radioactive rays upon said semiconductor element, and wherein a partial insulating, being disposed between other electrode neighboring with and having an area smaller than that of the pair of electrodes mentioned above, is provided at least on one of said pair of electrodes.

When trying to align/dispose the semiconductor detector modules to be dense or crowded, for increasing a positional resolving power of radioactive ray detection, normally, an electrically insulating layer is put between the electrode of one of the semiconductor elements neighboring with and the electrode of the other one thereof, for maintaining the electrical insulation between the semiconductor elements of the semiconductor detector modules neighboring with each other. In this instance, since the electrodes of the semiconductor elements neighboring with are so disposed that they face to each other while putting the electrically insulating layer therebetween, there is generated a parasitic capacity due to those electrodes and the electrically insulating layer. On the contrary to this, the semiconductor detector module described in the following Patent Document 1 is provided with an insulator having small area, at least on one (1) of the electrodes, and with this, it is said that the parasitic capacity can be reduced by lowering a dielectric constant between the electrodes.

PRIOR ART DOCUMENTS

Patent Documents

[Patent Document 1] Japanese Patent Laying-Open No. 2009-74817 (2009).

BRIEF SUMMARY OF THE INVENTION

Problem(s) to be Dissolved by the Invention

However, such parasitic capacity as was mentioned above is proportional to an area of the electrode, and is inversely proportional to distance between the electrodes, and therefore, it can be considered that it is difficult to reduce the parasitic capacity further, within the semiconductor detector module described in the above Patent Document 1.

Accordingly, an object of the present invention is to provide a radioactive ray detector for enabling to reduce the parasitic capacity lower than that of the conventional art, which is generated between the semiconductor elements of the radioactive ray detectors neighboring with, and a radioactive ray detecting apparatus applying that therein.

Means for Dissolving the Problem(s)

(I) As one embodiment of the present invention, there is provided a radioactive ray detector, comprising: a substrate; a first semiconductor element and a second semiconductor element, which are provided to face to each other with positioning said substrate therebetween; a first electrode pattern, which is electrically connected with said first semiconductor element on a surface facing to an opposite side of said substrate; and a second electrode pattern, which is electrically connected with said second semiconductor element on a surface facing to an opposite side of said substrate, wherein said first electrode pattern and said second electrode pattern are arranged not to overlap with each other, when seeing through said substrate in a direction of thickness thereof.

(II) As other embodiment of the present invention, there is provided radioactive ray detecting apparatus constructed by aligning plural numbers of radioactive ray detectors, wherein each of said radioactive ray detectors comprises: a substrate; a first semiconductor element and a second semiconductor element, which are provided to face to each other with positioning said substrate therebetween; a first electrode pattern, which is electrically connected with said first semiconductor element on a surface facing to an opposite side of said substrate; and a second electrode pattern, which is electrically connected with said second semiconductor element on a surface facing to an opposite side of said substrate, wherein said first electrode pattern and said second electrode pattern are arranged not to overlap with each other, when seeing through said substrate in a direction of thickness thereof.

Also, according to the present invention, in the embodiments (I) and (II) mentioned above, the following improvements and/or changes can be made thereto:

(i) Said first electrode pattern is formed on a first wiring member, said first wiring member is fixed on said first semiconductor element through a conductive adhesive, which is put between said first electrode pattern and said first semiconductor element, said second electrode pattern is formed on a second wiring member, and said second wiring member is fixed on said second semiconductor element through a conductive adhesive, which is put between said second electrode pattern and said second semiconductor element.

(ii) Said first electrode pattern is connected with one of corner regions of said first semiconductor element in a front surface view thereof, and said second electrode pattern is connected with said second semiconductor element in a corner region diagonally locating to said one corner region, with which said first electrode pattern is connected, when seeing through said substrate in a direction of thickness thereof.

(iii) A first dummy pattern is further formed on said first wiring member, not to overlap with said first electrode pattern, said first wiring member is fixed on said first semiconductor element through a conductive adhesive put between said first dummy pattern and said first semiconductor element, a second dummy pattern is further formed on said second wiring member, not to overlap with said second electrode pattern, and said second wiring member is fixed on said second semiconductor element through a conductive adhesive put between said second dummy pattern and said second semiconductor element.

(iv) Said first dummy pattern is bonded on said first semiconductor element in the corner region diagonally locating to said one corner region, with which said first electrode pattern is connected, and said second dummy pattern is bonded on said second semiconductor element in the corner region diagonally locating to said corner region, with which said second electrode pattern is connected.

Effect(S) of the Invention

According to the present invention, it is possible to provide the radioactive ray detecting apparatus, for enabling to reduce the areas where the radioactive rays cannot be detected, even when the radioactive ray detectors are disposed to be dense or crowded.

BRIEF DESCRIPTION OF THE SEVERAL VIEWS OF THE DRAWING

FIGS. 2A and 2B are front views for diagrammatically showing an example of a flexible substrate of the radioactive ray detector, according to the first embodiment of the present invention, wherein FIG. 2A shows the flexible substrate for electrically connecting between a semiconductor element, which is mounted on one surface of the substrate, and a substrate electrode, which is mounted on that one surface, while

FIGS. 6A and 6B are front view for diagrammatically showing an example of a flexible substrate of a radioactive ray detector, according to a second embodiment of the present invention, wherein FIG. 6A shows the flexible substrate for electrically connecting between a semiconductor element, which is mounted on one surface of the substrate, and a substrate electrode, which is mounted on that one surface, while

EMBODIMENT(S) FOR CARRYING OUT THE INVENTION

Basic Idea of the Present Invention

As was mentioned previously, the present invention

First Embodiment of the Present Invention

Outlook of Structures of Radioactive Ray Detector

Figure 1:
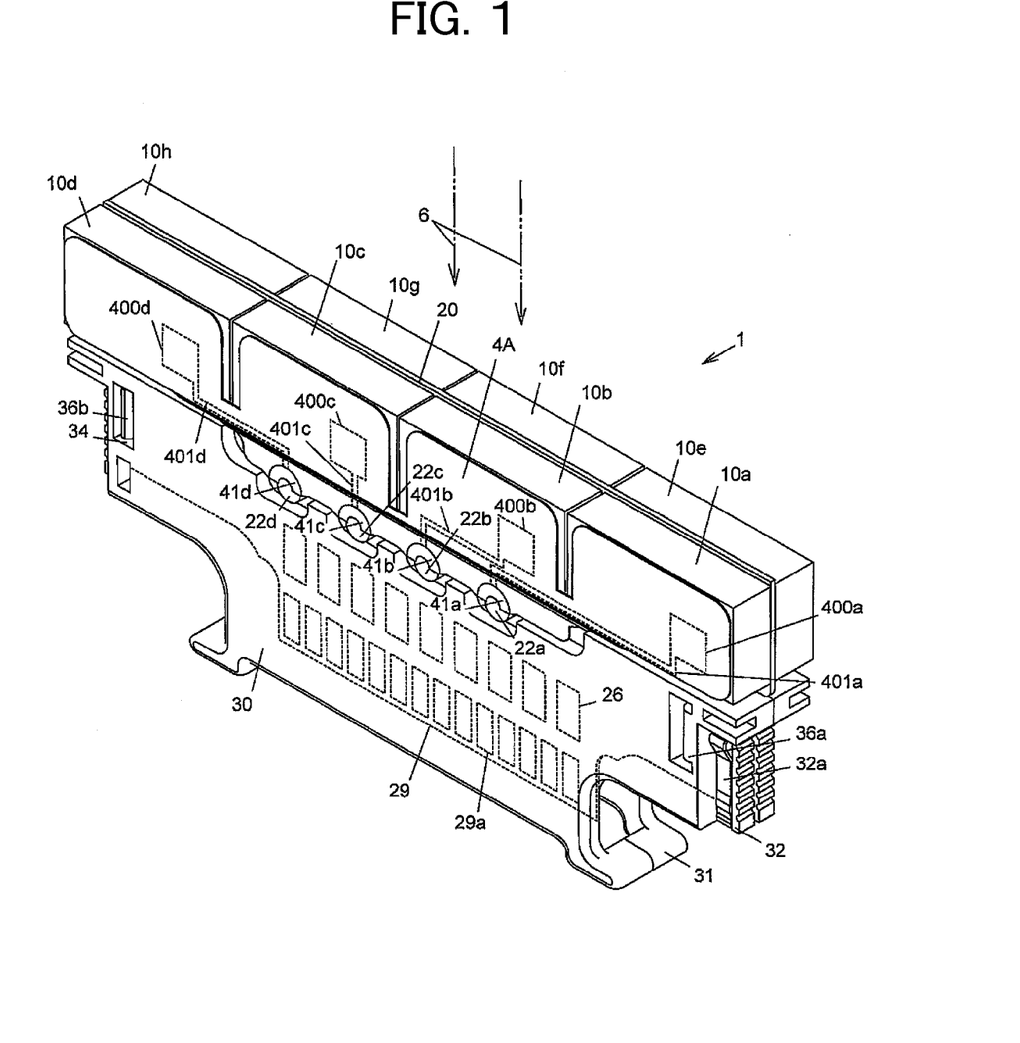
FIG. 1 is a perspective diagrammatic view for showing an example of a radioactive ray detector, according to a first embodiment of the present invention.

FIG. 1 is a perspective diagrammatic view for showing an example of a radioactive ray detector, according to a first embodiment of the present invention. In the below, the same reference numeral(s) will be attached on the similar element(s)/portion(s), and duplicated explanation(s) thereof will be omitted.

As is shown in FIG. 1, the radioactive ray detector 1, according to the present embodiment, is a radioactive ray detector, which has a card-like configuration and comprises semiconductor elements able to detect radioactive rays 6, such as, gamma (γ) rays or X-rays, etc. The semiconductor element is composed of, mainly, a compound semiconductor, and has a thin rectangular shape or a plate shape. As the compound semiconductor for making up the semiconductor element may be applied CdTe, preferably. However, the semiconductor element should not be limited to a CdTe element, but as far as it can detect the radioactive rays, such as, gamma (γ) rays or X-rays, etc. For example, as the semiconductor element may be also applied a compound semiconductor element, such as, a CdZnTe (CZT) element, a HGI2 element, etc. Hereinafter, explanation will be made by taking the CdTe element, as an example.

In the radioactive ray detector 1, for example, CdTe elements 10a-10d are disposes on one surface of a substrate 20 at a predetermined distance therebetween, while on the other surface of the substrate 20 are disposes CdTe elements 10e-10h at the predetermined distance therebetween. Also, the CdTe element 10a and the CdTe element 10e are disposes to oppose to each other via the substrate 20, the CdTe element 10b and the CdTe element 10f are disposes to oppose to each other via the substrate 20, the CdTe element 10c and the CdTe element 10g are disposes to oppose to each other via the substrate 20, and the CdTe element 10d and the CdTe element 10h are disposes to oppose to each other via the substrate 20, respectively.

The radioactive rays 6 propagate directing from an upper portion of the figure towards to a lower portion thereof. In other words, the radioactive rays 6 propagate along the direction directing from the semiconductor elements (i.e., the CdTe elements 10a-10h) to card holders 30-31, and thereby reaching onto the radioactive ray detector 1. And, the radioactive rays 6 are incident upon side surfaces of the CdTe elements 10a-10h (the side surface facing to the above in FIG. 1, i.e., an upper side surface), respectively. Thus, the respective surfaces of the CdTe elements 10a-10h define the incident surfaces of the radioactive rays 6. The radioactive ray detector, having the side surface of the semiconductor elements as the incident surfaces of the radioactive rays 6, in this way, is called an Edge-On type radioactive ray detector. The radioactive ray detector 1 according to the present embodiment 1 can be applied, preferably, as the radioactive ray detector for use in an Edge-On type radioactive ray detecting apparatus, in which plural numbers of the radioactive ray detectors are disposed to align (the details thereof will be mentioned later). However, it is needless to mention particularly, the idea of the present invention can be also applied to the radioactive ray detectors, but not of the Edge-On type.

The radioactive ray detector, according to the present embodiment, may be equipped with a collimator (for example, a multi-opening parallel collimator, a pin-hole collimator, etc.) or not, which has plural numbers of apertures, through which the radioactive rays 6 propagating along a specific direction (for example, the direction directing from an object to be detected to the radioactive ray detector 1). In the present embodiment, as an example, it is assumed that it applies the multi-opening parallel collimator (not shown in the figure) therein.

(Details of Substrate 20)

As the substrate 20 of the radioactive ray detector 1, according to the present embodiment, may be applied one being formed by putting a thin-type substrate (for example, a glass epoxy substrate, such as, FR4, etc.), on the surface of which a conductive film made of a conductive material, such as, a metal conductor, etc. (for example, a copper foil), between insulation layers made of an insulating material, such as, a solder resist, etc. Preferably, thickness of the substrate 20 is the thickness approximately equal to a wall portion separating the plural numbers of the openings of the collimator, or less than that. As an example, the thickness of the substrate 20 is equal to or less than 0.3 mm.

Also, the substrate 20 has an area or region, on which plural numbers of the semiconductor elements (i.e., the CdTe elements 10a-10h) are mounted (i.e., an upper end region in FIG. 1), and a card edge portion 29, on which an edge wiring pattern 29a is provided for connecting the signal from the semiconductor element to an external electric circuit. The card edge portion 29 is provided on the side opposite to where the element mounting portion on the substrate 20, wherein the card edge portion 29 is formed to be narrower in width thereof than that of the width of the element mounting portion. The substrate 20 has length of about 40 mm in the longitudinal direction (i.e., the width of the element mounting portion, in the horizontal direction in FIG. 1) as a size thereof, as an example, and has length of about 20 mm in the short direction (i.e., from an end of the element mounting portion to an end of the card edge portion 29, the vertical direction in FIG. 1).

Also, between the element mounting portion and the card edge portion 29 is provided an electronic part mounting portion 26 for mounting thereon electronic parts (for example, resistors and/or capacitors, etc.), to be electrically connected with the semiconductor elements (i.e., the CdTe elements 10a-10h), respectively. However, on the electronic part mounting portion 26 can be mounted an Application Specific Integrated Circuit (ASIC), a Field Programmable Gate Array (FPGA), etc.

Further, the substrate 20 has plural numbers of pillar-like substrate terminals projecting from the surface of the substrate 20 along a normal line from this surface, between the element mounting portion and the electronic part mounting portion 26. The substrate terminal may be round column-like or rectangular column-like.

In FIG. 1 is shown an example, where four (4) pieces of round column-like substrate terminals 22a-22d are formed on one surface (on a front surface side) of the substrate 20. The CdTe elements 10a-10d and the substrate terminals 22a-22d are electrically connected with, through a flexible substrate 4A. On the other side (a rear surface side) of the substrate 20 are also formed the substrate terminals (see FIG. 3, which will be mentioned later) having the same structures of the substrate terminals 22a-22d on the front surface side, wherein those substrate terminals and the CdTe elements 10a-10h electrically connected with, through a flexible substrate 4B (see FIG. 2, which will be mentioned later).

In more details, the substrate 22a is electrically connected with a connector portion 41a of the flexible substrate 4A, and the connector portion 41a is electrically connected with an electrode pattern 400a, through a wiring pattern 401a. The substrate terminal 22b is electrically connected with a connector portion 41b of the flexible substrate 4A, and the connector portion 41b is electrically connected with an electrode pattern 400b, through a wiring pattern 401b. The substrate 22c is electrically connected with a connector portion 41c of the flexible substrate 4A, and the connector portion 41c is electrically connected with an electrode pattern 400c, through a wiring pattern 401c. The substrate 22d is electrically connected with a connector portion 41d of the flexible substrate 4A, and the connector portion 41d is electrically connected with an electrode pattern 400d, through a wiring pattern 401d. The detailed explanation relating to the flexible substrates 4A-4B will be given later.

The substrate 20 is supported with being put between the card holders 30 and 31. Although there is no specific limitation in the configurations of those card holders 30 and 31; however, in FIG. 1, those are shaped into the same configuration, respectively. As a manner of putting it between them, for example, a projecting portion 36b, which the card holder 31 has, is inserted into a hole 34 with groove, which the card holder 30 has, and thereby the substrate 20 is supported.

An elastic member mounting portion 32 is a portion, on which an elastic member 32a for fixing the radioactive ray detector 1 by pushing it onto a radioactive ray detector supporting portion 72 (see FIG. 5, which will be mentioned later), when plural numbers of the radioactive ray detectors 1 are into the radioactive ray detector stand. Also, for the radioactive ray detector stand, it is preferable to have a connector 71 (see FIG. 7, which will be mentioned later), into which the card edge portion 29 is inserted. The radioactive ray detectors 1, in particular, the card edge portion 20 thereof is inserted into the connector 71, and then the edge wiring pattern 29a of the card edge portion 20 and the connector electrode are in contact with; thereby being electrically connected with the external electric circuit (for example, a controller circuit, a power source line from an outside, a grand line, etc.)

(Details of Flexible Substrates 4A and 4B)

Figure 2A:
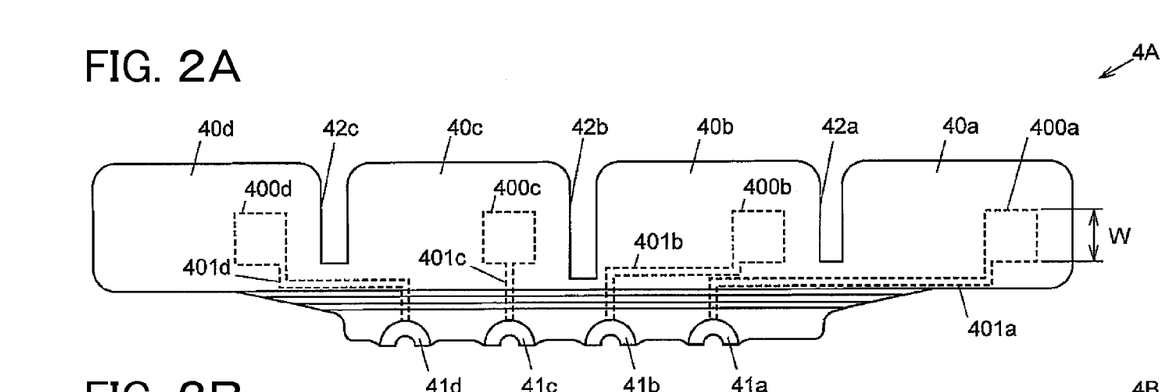
Figure 2B:
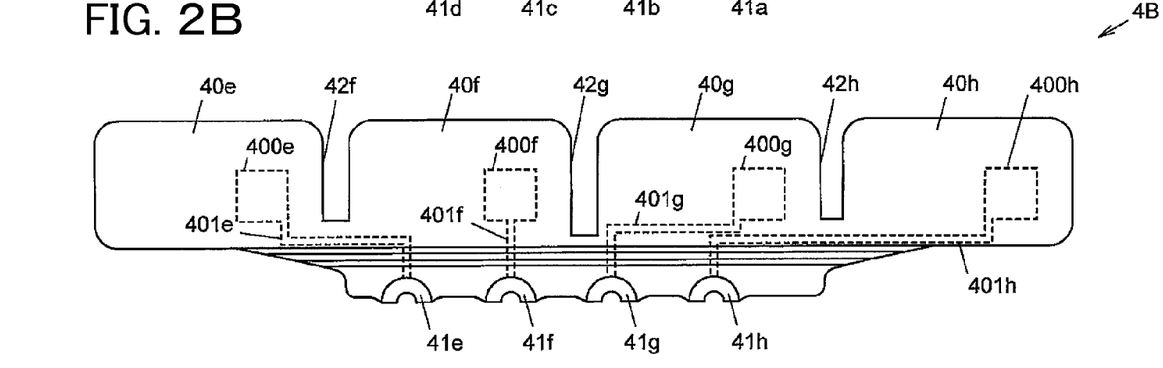
FIG. 2B shows the flexible substrate for electrically connecting between a semiconductor element, which is mounted on the other surface of the substrate, and a substrate electrode, which is mounted on that other surface.

FIGS. 2A and 2B are front views for diagrammatically showing an example of a flexible substrate of the radioactive ray detector, according to the first embodiment of the present invention, wherein FIG. 2A shows the flexible substrate for electrically connecting between a semiconductor element, which is mounted on one surface of the substrate, and a substrate electrode, which is mounted on that one surface, while FIG. 2B shows the flexible substrate for electrically connecting between a semiconductor element, which is mounted on the other surface of the substrate, and a substrate electrode, which is mounted on that other surface. The flexible substrate 4A (a first wiring member) and the flexible substrate 4B (a second wiring member) are wiring members, obtained by forming a conductive patter(s) on a substrate of a resin file (for example, a polyimide film). However, in FIGS. 2A and 2B, since the first electrode patterns 400a-400d, the second electrode patterns 400e-400h, and the wiring patterns 401a-401h are provided on the reverse surface side of the resin film (i.e., on the sides of the flexible substrates 4A and 4B facing to the substrate 20), those are illustrated by broken lines (or dotted line) in the figure.

As is shown in FIG. 2A, the flexible substrate 4A has convex-like area or regions 40a-40d, which are formed corresponding to the CdTe elements 10a-10d, respectively. Each of those convex-like regions 40a-40d is machined to be an arc-like on every corner thereof. This machining at this corner is for the purpose of protecting the CdTe element from being injured by sharp edges of the convex-like regions 40a-40d when the flexible substrate 4A is attached on each CdTe element.

Also, the flexible substrate 4A has a slit 42a between the convex-like regions 40a and 40b, a slit 42b between the convex-like regions 40b and 40c, and a slit 42c between the convex-like regions 40c and 40d. Those slits 42a-42c are formed so that the corners of the CdTe elements neighboring with each other among the CdTe elements 10a-10d are exposed therethrough. With forming those slits, the CdTe element can be protected from being injured when the flexible substrate 4A contacts at the corner of the CdTe element.

The flexible substrate 4A has connector portions 41a-41d, each being shaped to be semicircular, approximately, in a lower portion in FIG. 2A. Those connector portions 41a-41d are patterns, which are formed with using a conductive material (for example, Cu, etc.) The connector portion 41a is electrically connected, as was shown in FIG. 1, with the substrate terminal 22a. In the similar manner, the connector portion 41b is electrically connected with the substrate terminal 22b, the connector portion 41c with the substrate terminal 22c, and the connector portion 41d with the substrate terminal 22d, respectively.

The convex-like region 40a has the electrode pattern 400a having a square shape, and the wiring pattern 401a for connecting this electrode pattern 400a with the connector portion 41a. In the similar manner, the convex-like region 40b has the electrode pattern 400b having a square shape, and the wiring pattern 401b for connecting this electrode pattern 400b with the connector portion 41b. The convex-like region 40c has the electrode pattern 400c having a square shape, and the wiring pattern 401c for connecting this electrode pattern 400c with the connector portion 41c. The convex-like region 40d has the electrode pattern 400d having a square shape, and the wiring pattern 401d for connecting this electrode pattern 400d with the connector portion 41d. Those electrode patterns 400a-400d and wiring patterns 401a-401d are formed with using a conductive material (for example, Cu, etc.) However, the shape of the electrode patterns 400a-400d should not be limited to the square shape.

Similar to the flexible substrate 4A, the flexible substrate 4Bb has, as is shown in FIG. 2B, has convex-like regions 40e-40h, which are formed corresponding to the CdTe elements 10e-10h, respectively. Each of those convex-like regions 40e-40h is machined to be an arc-like on every corner thereof. This machining at this corner is for the purpose of protecting the CdTe element from being injured by sharp edges of the convex-like regions 40e-40h when the flexible substrate 4B is attached on each CdTe element.

Also, the flexible substrate 4B has a slit 42f between the convex-like regions 40e and 40f, a slit 42g between the convex-like regions 40f and 40g, and a slit 42h between the convex-like regions 40g and 40h. Those slits 42f-42h are formed so that the corners of the CdTe elements neighboring with each other among the CdTe elements 10e-10h are exposed therethrough. With forming those slits, the CdTe element can be protected from being injured when the flexible substrate 4B contacts at the corner of the CdTe element.

The flexible substrate 4B has connector portions 41e-41h, each being shaped to be semicircular, approximately, in a lower portion in FIG. 2B. Those connector portions 41e-41h are patterns, which are formed with using a conductive material (for example, Cu, etc.) Those connector portions 41e-41h are electrically connected with the substrate terminals not shown in the figure, which are provided on the reverse surface side of the substrate 20 shown in FIG. 1. However, the above-mentioned substrate terminals not shown in the figure are formed, similar to the substrate terminals 22a-22d shown in FIG. 1, on the reverse surface side of the radioactive ray detector shown in FIG. 1.

The convex-like region 40e has the electrode pattern 400e having a square shape, and the wiring pattern 401e for connecting this electrode pattern 400e with the connector portion 41e. In the similar manner, the convex-like region 40f has the electrode pattern 400f having a square shape, and the wiring pattern 401f for connecting this electrode pattern 400f with the connector portion 41f. The convex-like region 40g has the electrode pattern 400g having a square shape, and the wiring pattern 401g for connecting this electrode pattern 400g with the connector portion 41g. The convex-like region 40h has the electrode pattern 400h having a square shape, and the wiring pattern 401h for connecting this electrode pattern 400h with the connector portion 41h. Those electrode patterns 400e-400h and wiring patterns 401e-401h are formed with using a conductive material (for example, Cu, etc.) However, the shape of the electrode patterns 400e-400h should not be limited to the square shape.

An area of the electrode pattern 400a is determined, preferably, about ¼ of the area of the convex-like region 40a. Also, the electrode pattern 400a is arranged within one of the regions on the convex-like region 40a, being divided to the left and the right with respect to a center line thereof. In FIG. 2A is shown an example where it is formed leaning to the left side in the figure. Areas of the electrode patterns 400b-400h, as well as, arrangements thereof within the convex-like regions 40b-40h, are also same to those of the electrode pattern 400a. Further, length "W" of one side of the patterns 400a-400h is 2-3 mm, for example.

(Details of Radioactive Detector 1)

Figure 3:
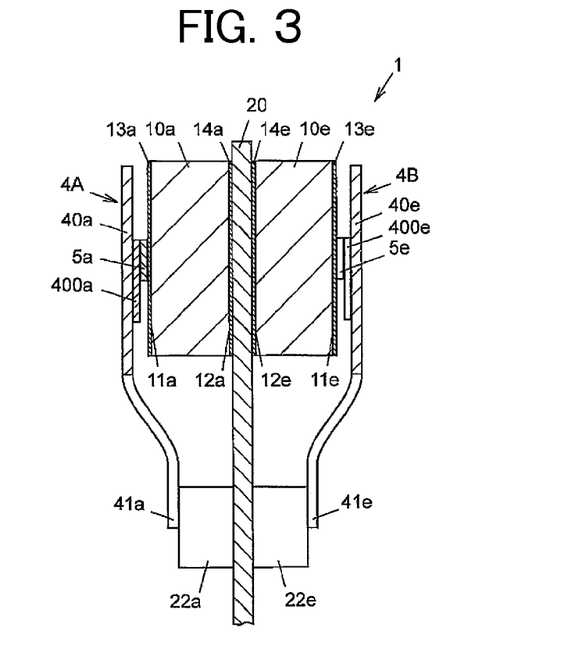
FIG. 3 is an enlarged cross-section view for diagrammatically showing an example of the radioactive ray detector, according to the first embodiment of the present invention.

FIG. 3 is an enlarged cross-section view for diagrammatically showing an example of the radioactive ray detector, according to the first embodiment of the present invention. Hereinafter, although explanation will be made on the CdTe elements 10a and 10e, as representative ones of the semiconductor elements of the radioactive ray detector according to the present invention, but similarly, it is also true for the other semiconductor elements (i.e., the CdTe elements 10b-d, 10f-h).

As is shown in FIG. 3, the CdTe element 10a has a first electrode 14a on an element surface 12a facing to the substrate 20, and a second electrode 13a on an element surface 11a opposite to the substrate 20 (i.e., on the side facing to the flexible substrate 4A). The electrode pattern 400a of the flexible substrate 4A is electrically connected with the second electrode 13a of the CdTe element 10a through a conductive adhesive 5a. On the element surface 12a of the CdTe element 10a facing to the substrate 20 are provided plural numbers of grooves (not shown in the figure) in the direction of propagation of the radioactive rays (i.e., in the vertical direction in the figure), wherein the first electrode 14a is divided into plural numbers thereof by the grooves. Each one of the first electrodes 14a divided are electrically connected with plural numbers of element connector portions (not shown in the figure) made of a conductive material (for example, Cu, etc.), respectively, which is formed on the element mounting portion of the substrate 20.

Similar to the CdTe element 10a, the CdTe element 10e has a first electrode 14e on an element surface facing to the substrate 20, and a second electrode 13e on an element surface 11e opposite to the substrate 20 (i.e., on the side facing to the flexible substrate 4B). The electrode pattern 400e of the flexible substrate 4B is electrically connected with the second electrode 13e of the CdTe element 10e through a conductive adhesive 5e. On the element surface 12e of the CdTe element 10e facing to the substrate 20 are provided plural numbers of grooves (not shown in the figure) in the direction of propagation of the radioactive rays (i.e., in the vertical direction in the figure), wherein the first electrode 14e is divided into plural numbers thereof by the grooves. Each one of the first electrode 14e divided are electrically connected with plural numbers of element connector portions (not shown in the figure) made of a conductive material (for example, Cu, etc.), respectively, which is formed on the element mounting portion of the substrate 20. However, there is no specific limitation for the conductive adhesive 5a and/or 5b; but preferably, an Ag paste may be applied thereto. Hereinafter, the conductive adhesive will be described as a conductive adhesive 5, collectively, but except for when separating them for the purpose of explanation thereof.

Although the details thereof will be omitted herein, in the similar manner to that mentioned above, the CdTe elements 10b-10d and 10f-10h have second electrodes 13b-13d and 13f-13h on surfaces 11b-11d and 11f-11h on opposite side to the substrate 20 (i.e., on the side facing to the flexible substrate), respectively, and first electrodes 14b-14d and 14f-14h, which are divided by plural numbers of grooves, on the surfaces 12b-12d and 12f-12h on the side facing to the substrate 20. Electrode patterns 400b-400d of the flexible substrate 4A are electrically connected with electrodes 13b-13d of the CdTe elements 10b-10d through the conductive adhesive 5, while electrode patterns 400f-400h of the flexible substrate 4B are electrically connected with electrodes 13f-13h of the CdTe elements 10b-10d through the conductive adhesive 5. Each of the first electrodes 14b-14d and 14f-14h divided is electrically connected with each of the plural numbers of element connector portions, respectively, which are formed on the element mounting portions of the substrate and made of the conductive material. The conductive adhesive 5 may be applied when connecting between the first electrode and the element connector portion.

As was mentioned above, the semiconductor element of the radioactive ray detector according to the present invention is divided into plural numbers of regions by the plural numbers of grooves, which are formed on the surface facing to the substrate 20. Mentioning in more details thereof, each semiconductor element builds up "n" pieces of pixel regions therein, which are divided by (n−1) pieces of grooves, each being able to detect the radioactive rays between the first electrode and the second electrode, respectively, and wherein the incident surfaces of the radioactive rays (i.e., an upper surface) corresponds to the "n" pieces of pixels for detecting the radioactive rays. And, as one example, in case where one (1) radioactive ray detector 1 comprises eight (8) pieces of the CdTe elements 10a-10h, and each of the CdTe elements has eight (8) pixels, the one (1) radioactive ray detector 1 has a resolving power of 64 pixels. With increasing/decreasing the number of the grooves, it is possible to increase/decrease the pixel number of one (1) piece of the CdTe element. Also, it is preferable that the grooves are formed at an equal distance therebetween.

Herein, in the present embodiment, it is preferable that one (1) pixel region of the CdTe element, which is mounted on one surface of the substrate 20, and a pixel region of the CdTe element, which is positioned symmetrically to that one (1) pixel upon the substrate 20 as a symmetric surface, are electrically connected with, through the penetrating conductive portion (not shown in the figure) penetrating through the substrate 20.

Figure 4A:
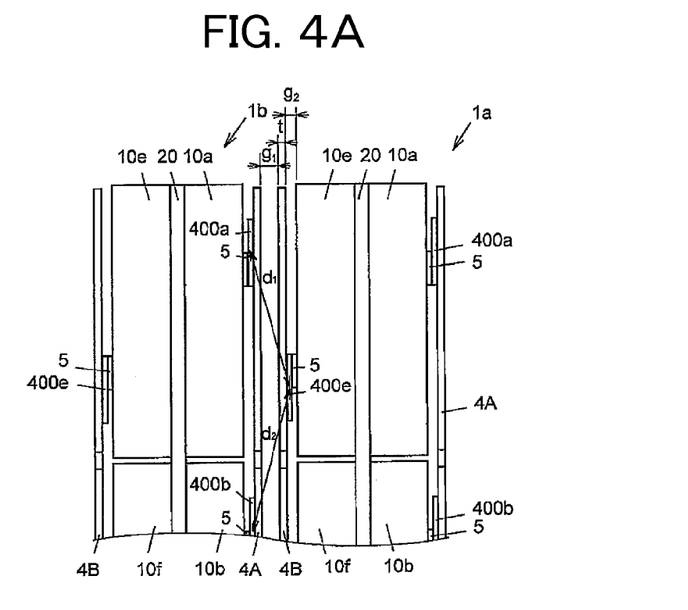
FIG. 4A is an enlarged upper view of the radioactive ray detectors according to the first embodiment of the present invention, in particular, when they are seen from an incident surface side of radioactive rays, under the condition of being disposed to align.
Figure 4B:
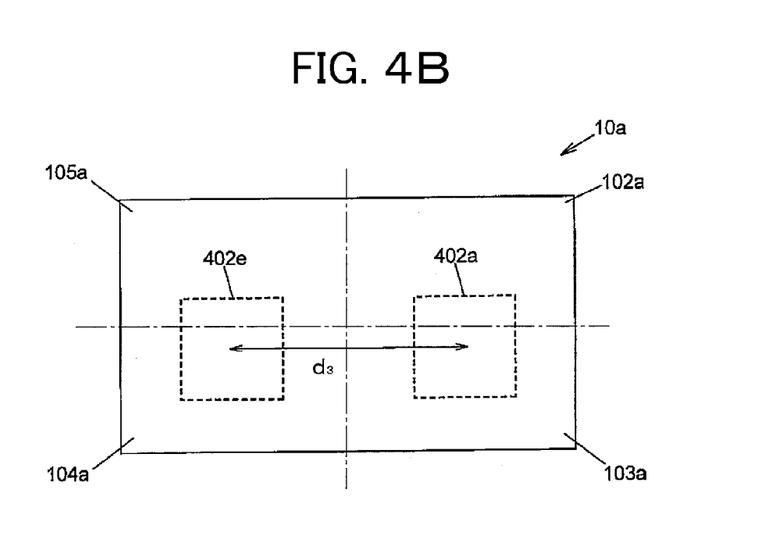
FIG. 4B is a perspective view seen from the front surface thereof, for showing positional relationships between a first electrode pattern and a second electrode pattern, in particular, when seeing through the radioactive ray detectors according to the first embodiment of the present invention, in the direction of thickness of a substrate.

FIG. 4A is an enlarged upper view of the radioactive ray detectors according to the first embodiment of the present invention, in particular, when they are seen from an incident surface side of radioactive rays, under the condition of being disposed to align. FIG. 4B is a perspective view seen from the front surface thereof, for showing positional relationships between a first electrode pattern and a second electrode pattern, in particular, when seeing through the radioactive ray detectors according to the first embodiment of the present invention, in the direction of thickness of a substrate. However, in FIG. 14A, for the purpose of simplification of the explanation, the electrodes (i.e., the first electrode and the second electrode) are omitted, which are formed on both surfaces of the CdTe element. Also, in FIG. 4B, see-through images of the electrode patterns are shown by dotted lines.

As is shown in FIG. 4A, the radioactive ray detectors 1a and 1b, having the same structure to that of the radioactive ray detectors 1, are disposed to align at distance "$g_1$" (for example, 100 μm) therebetween. Further, thickness of the resin film of the flexible substrate is determined to "t", and the distance between the CdTe element and the flexible substrate is "$g_2$" (for example, 30 μm). Herein, while paying an attention to the electrode pattern 400e of the radioactive ray detectors 1a, a parasitic capacity is generated due to electrostatic bond, mainly, between the electrode patterns 400a and 400b of the radioactive ray detectors 1b and the second electrode of the CdTe element 10a of the radioactive ray detectors 1b. Among those, since it can be considered that an influence of the parasitic capacity between the electrode pattern 400e of the radioactive ray detectors 1a and the electrode pattern 400a of the radioactive ray detectors 1b, and that between the electrode pattern 400e of the radioactive ray detectors 1a and the electrode pattern 400b of the radioactive ray detectors 1b are largest, therefore explanation will be given on reduction of those parasitic capacities.

The parasitic capacity is proportional to areas of the electrode patterns 400a, 400b and 400e, while it is inverse proportional to the distance between the electrode patterns 400e and 400a or between the electrode patterns 400e and 400b. Thus, for reducing the parasitic capacity, it is sufficient to make those areas small, and those distances long. However, if simply widening the distance "$g_1$" between the radioactive ray detectors 1a and 1b and extending the distances between those electrode patterns, there is generated a demerit of lowering the accuracy of detecting the radioactive rays, remarkably.

Then, according to the present embodiment, by forming the electrode patterns, each being sufficiently smaller comparing to the area of the element surface on the CdTe element, on the flexible substrates 4A and 4B, and by disposing those electrode patterns so that they themselves do not face to each other, it is possible to extend the distances "$d_1$" and "$d_2$" to be longer than the distance when those electrode patterns face to each other (i.e., the distance obtained by adding the distance "$g_1$" and two times of the thickness "t"). In other words, according to the present embodiment, the electrode pattern 400e, which is electrically connected with the CdTe element 10e, and the electrode pattern 400a, which is electrically connected with the CdTe element 10a facing to that while positioning the substrate 200 therebetween, are disposed, so that they do not overlap with each other when seeing them through in the thickness direction of the substrate 20. With this structure, it is possible to reduce the parasitic capacity. Herein, the distance "$d_1$" is the distance between a center of the electrode pattern 400e of the radioactive ray detector 1a and a center of the electrode pattern 400a of the radioactive ray detector 1b, as is shown in FIG. 4A, while the distance "$d_2$" is the distance between the center of the electrode pattern 400e of the radioactive ray detector 1a and a center of the electrode pattern 400b of the radioactive ray detector 1b.

As is shown in FIG. 4B, it is assumed that the distance between a center of front surface see-through image 402a of the electrode pattern 400a and a center of front surface see-through image 402e of the electrode pattern 400e of the radioactive ray detector 1 is "$d_3$". If extending the distance "$d_3$" to be long, then the distance "$d_1$" comes to be long; however, the distance "$d_2$" comes to be short. Thus, for reducing the parasitic capacity as a whole, it is preferable to determine the distance "$d_3$" in such a manner that the distances "$d_1$" and "$d_2$" are well balanced.

The following structure can be considered as a variation of the present embodiment. Assuming four (4) corner areas or regions 102a-105a obtained by dividing the CdTe element 10a into up and down and left and right (see FIG. 4B), the electrode patterns 400a and 400e are so arranged that the front surface see-through images 402a and 402e are located at the corner regions 102a and 104a positioning diagonally, or the corner regions 103a and 105a. In more details, in FIG. 4B, they are so arranged that the front surface see-through images 402a and 402e are shifted in the vertical direction. With this, it is possible to elongate the distance "$d_3$" much more. This is also true for other pairs of front surface see-through images (402b and 402f, 402c and 402g, and 402d and 402h) of the electrode patterns.

Also, in the variation mentioned above, for example, when arranging the front surface see-through image 402a at the corner region 103a while the front surface see-through image 402e at the corner region 105a, and also arranging the front surface see-through images of the other electrode patterns in the similar manner, then the front surface see-through image of the electrode pattern results to locate at the right-lower corner region (corresponding to the corner region 103a on the CdTe element 10a) among the our (4) corner regions obtained by dividing the CdTe element 10a into up and down and left and right. Thus, the distance "$d_2$" come to be longer comparing to that before the front surface see-through images 402a and 402e are sifted in the vertical direction. As a result thereof, it is possible to reduce the parasitic capacity due to the electrode pattern 400e of the radioactive ray detector 1a and the electrode pattern 400b of the radioactive ray detector 1b, much more.

As was explained in the above, the radioactive ray detector 1 according to the first embodiment of the present invention, comprises the substrate 20, the CdTe elements 10a and 10e able to detect the radioactive rays 6, which are provided facing to each other putting the substrate 20 therebetween, and the electrode pattern 400e for electrically connecting the surface of the CdTe element 10e facing to the substrate 20 and the surface opposite to that, wherein the electrode patterns 400a and 400e are so arranged that the front surface see-through images 402a and 402e thereof do not overlap with each other (located in the regions different from each other).

(Details of Radioactive Ray Detecting Apparatus 7)

Figure 5:
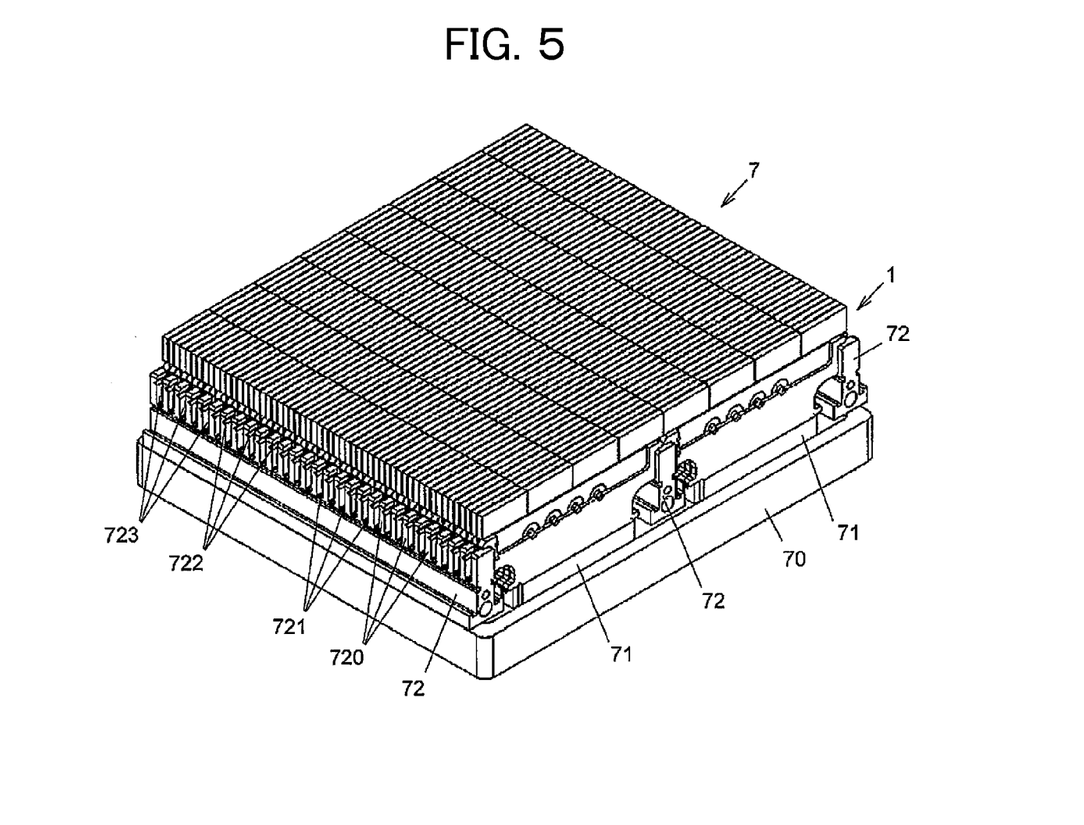
FIG. 5 is a perspective diagrammatic view for showing an example of a radioactive ray detecting apparatus, according to the present invention, being constructed by plural numbers of the radioactive ray detectors according to the first embodiment.

FIG. 5 is a perspective diagrammatic view for showing an example of a radioactive ray detecting apparatus, according to the present invention, being constructed by plural numbers of the radioactive ray detectors according to the first embodiment. As is shown in FIG. 5, the radioactive ray detecting apparatus 7, according to the present invention, is constructed by aligning/arranging plural numbers radioactive ray detectors 1 by means of a radioactive ray detector stand. The radioactive ray detector stand comprises plural numbers of radioactive ray detector supporting bodies 72, each forming plural numbers of grooves 721 thereon, being aligned at a predetermined distance depending on the distance at which the plural numbers of the radioactive ray detectors 1 are aligned, and to be inserted with the plural numbers of the radioactive ray detectors 1 therein, a supporting plate 70 for mounting the radioactive ray detector supporting bodies 72 thereon, and plural numbers of connectors 71, being provided between the plural numbers of the radioactive ray detector supporting bodies 72, and also being connected with the card edge portions of the plural numbers of the radioactive ray detectors 1, respectively, thereby connecting with the external electric circuit. In each of the grooves 721 of the radioactive ray detector supporting bodies 72 in inserted the radioactive ray detector 1, respectively, and thereby such radioactive ray detecting apparatus 7 is built up, as shown in FIG. 5.

The radioactive ray detector supporting bodies 72 are provided on the supporting plate 70, so as to have the distance therebetween corresponding to width of the radioactive ray detector 1. And, each of the radioactive ray detector supporting bodies 72 has plural pieces of wall potions 720, respectively, and the groove 721 is formed between the wall portions, for each. As an example, the wall portion 720 is provided a recess portion 722 on one surface thereof, and is formed a flat surface 723 on the other surface thereof. The radioactive ray detector supporting body 72 is can be formed, for example, through a cut machining, etc., from a metal block. In case of forming the radioactive ray detector supporting body 72 through the cut machining of the metal block, it is possible to form the grooves 721 by plural numbers thereof, to have an accuracy of ±0.02 mm at least.

As was mentioned previously, into the elastic member mounting portion 32 of the radioactive ray detector 1 is installed the elastic member 32a, being formed by using a plate metal, for example. When the radioactive ray detector 1 is inserted into the groove 721 of the radioactive ray detector supporting bodies 72, the radioactive ray detector 1 is pushed onto the flat surface 723 of the wall portion 720 by this elastic member 32a, and thereby the radioactive ray detector 1 is fixed on the radioactive ray detector supporting bodies 72.

Though not shown in FIG. 5, it is preferable that a collimator having plural numbers of openings is equipped in an upper portion (in a front of the incident surface of the radioactive rays) in FIG. 5 showing the radioactive ray detecting apparatus. With using the collimator, it is possible to detect only the radioactive rays from a specific direction on the CdTe element. As an example, the plural numbers of openings are formed, approximately, into a square shape. In this case, each of the openings has a size of 1.2 mm on one side thereof, for example, and they are formed to be aligned in a grid-like manner at 1.4 mm pitch. In that collimator, thickness of the wall portion separating one (1) opening from other openings neighboring with this one opening is 0.2 mm. Further, the distance between the radioactive ray detector 1 and the collimator is 1-5 mm, for example.

Also, when using the collimator, it is required that the positions of the plural numbers of openings of the collimator correspond to that of the pixels of the CdTe element, respectively. If this relationship of correspondence is broken, the wall portions (may be also called "separation wall" or "captor") separating the plural numbers of openings of the collimator come to locate on the pixels, then this reduces a dissolving power of the radioactive ray detection. Accordingly, for the purpose of preventing such situation, so as to achieve high positional accuracy, it is required to narrow the distance "$g_1$" between the plural numbers of radioactive ray detectors 1. Moreover, when trying to increase the dissolving power of the radioactive ray detection by reducing the opening size of the collimator, further high positional accuracy is required.

The radioactive ray detector 1, according to the present embodiment, comprises the substrate 20 having the thickness being nearly equal to the thickness of the wall portion separating the openings of the collimator or less than that, the distance "$g_1$" between the plural numbers of radioactive ray detectors 1 can be determined to be equal to or less than the thickness of the wall portion.

Effect(s) of First Embodiment

With the radioactive ray detector 1, according to the first embodiment of the present invention, since the electrode patterns of the radioactive ray detector 1 are formed themselves in such regions that they never face to each other, it is possible to reduce the parasitic capacity generating between the electrode patterns.

Second Embodiment of the Present Invention

A second embodiment of the present invention differs from the first embodiment, in particular, in an aspect of providing demy patterns on the flexible substrate. However, in each embodiment which will be shown below, the part(s) having the structure (s) and the function(s) to those of the embodiment 1 is/are attached with the same reference numeral(s) to that of the embodiment 1, and the explanation(s) thereof will be omitted herein.

Figure 6A:
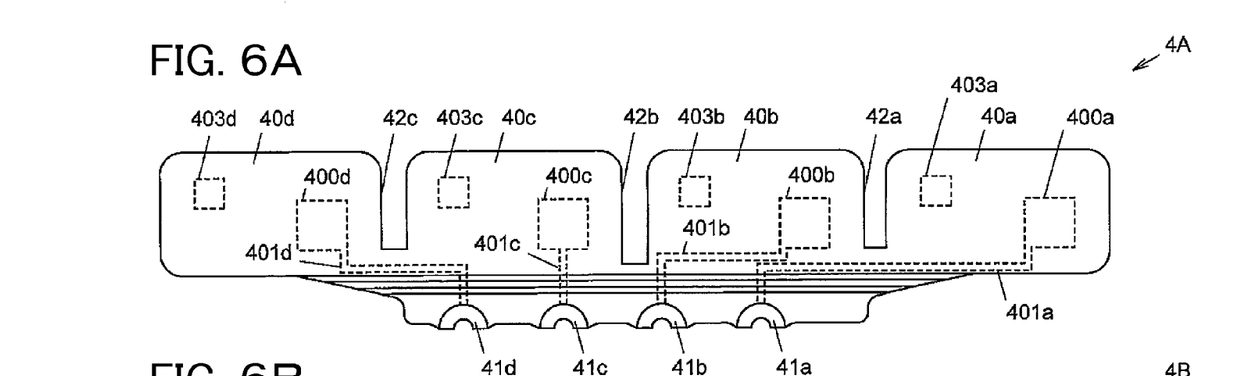
Figure 6B:
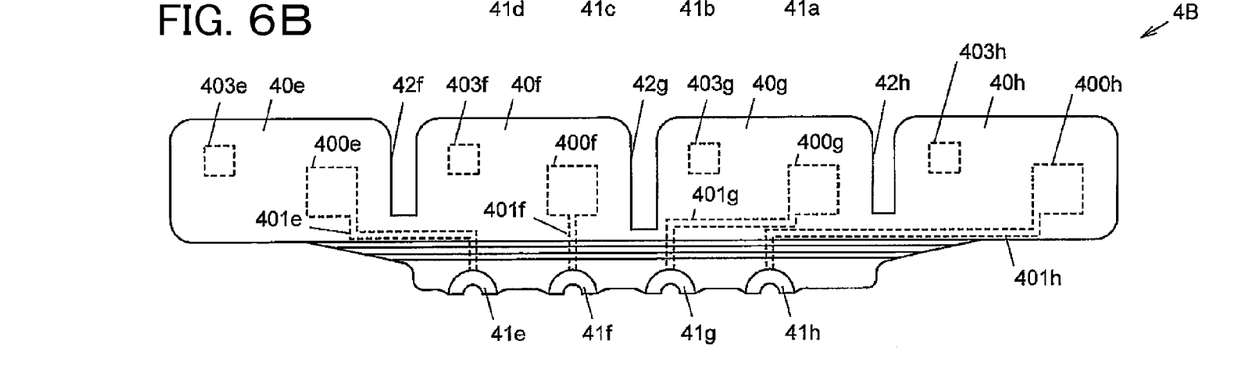
FIG. 6B shows the flexible substrate for electrically connecting between a semiconductor element, which is mounted on the other surface of the substrate, and a substrate electrode, which is mounted on that other surface.

FIGS. 6A and 6B are front view for diagrammatically showing an example of a flexible substrate of a radioactive ray detector, according to a second embodiment of the present invention, wherein FIG. 6A shows the flexible substrate for electrically connecting between a semiconductor element, which is mounted on one surface of the substrate, and a substrate electrode, which is mounted on that one surface, while FIG. 6B shows the flexible substrate for electrically connecting between a semiconductor element, which is mounted on the other surface of the substrate, and a substrate electrode, which is mounted on that other surface. FIG. 6A shows the flexible substrate 4A to be connected with the CdTe elements 10a-10d, while FIG. 6B shows the flexible substrate 4B to be connected with the CdTe elements 10e-10h. However, in those FIGS. 6A and 6B, since the electrode patterns 400a-400h, the dummy patterns 403a-403h and the wiring patterns 401a-401h are provided on the reverse side surfaces of the resin films (i.e., on the sides of the flexible substrates 4A and 4B facing to the substrate 20), they are shown by broken lines (or dotted lines).

As is shown in FIG. 6A, the flexible substrate 4A has, in addition to the case of the first embodiment mentioned above, the dummy pattern 403a in the convex-like region 40a, the dummy pattern 403b in the convex-like region 40b, the dummy pattern 403c in the convex-like region 40c, and the dummy pattern 403d in the convex-like region 40d, respectively. Those dummy patterns 403a-403d have a square shape, for example, and are independent patterns.

As is shown in FIG. 6B, also the flexible substrate 4B has the dummy pattern 403e in the convex-like region 40e, the dummy pattern 403f in the convex-like region 40f, the dummy pattern 403g in the convex-like region 40g, and the dummy pattern 403h in the convex-like region 40h, respectively. Those dummy patterns 403e-403h have the square shape, for example, and are independent patterns.

However, in FIGS. 6A and 6B, the dummy patterns 403a-403h are formed to be square in the shape thereof, having an area smaller than that of the electrode pattern; however the are and the shape thereof should not be limited to those.

Figure 7:
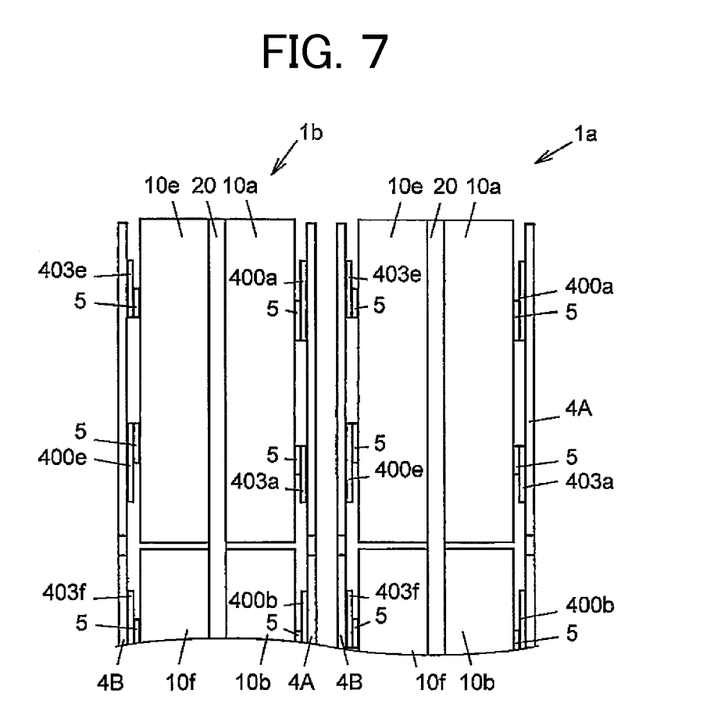
FIG. 7 is an enlarged upper view of the radioactive ray detectors according to the second embodiment of the present invention, in particular, when they are seen from an incident surface side of radioactive rays, under the condition of being disposed to align.

FIG. 7 is an enlarged upper view of the radioactive ray detectors according to the second embodiment of the present invention, in particular, when they are seen from an incident surface side of radioactive rays, under the condition of being disposed to align. As is shown in FIG. 7, the dummy patterns 403a-403h are used as parts for connecting the flexible substrates 4A and 4B with the CdTe elements 10a-10h, by positioning the conductive adhesive 5 between them. For this reason, the dummy patterns 403a-403h are preferably formed by using a material, which can be bonded by the conductive adhesive.

The following structure can be considered as a variation of the second embodiment. As is shown in FIG. 4B, assuming four (4) corner areas or regions 102a-105a obtained by dividing the CdTe element 10a into up and down and left and right, the electrode patterns 400a and 400e are so arranged that the dummy pattern 403a and the electrode pattern 400a are located at the corner regions 102a and 104a positioning diagonally, or the corner regions 103a and 105a. This is also true for the combinations (for example, 403e and 400e) in other convex-like regions.

Effect(s) of Second Embodiment

With the radioactive ray detector, according to the second embodiment of the present invention, since the CdTe elements and the flexible substrates 4A and 4B are fixed with, further, even on the dummy patterns 403a-403h, comparing to the case of the radioactive ray detector according to the first embodiment (i.e., the CdTe elements and the flexible substrates 4A and 4B are fixed by the conductive adhesive 5, on the electrode patterns 400a-400h), the flexible substrates 4A and 4B can be protected from being curved.

Third Embodiment of the Present Invention

In the first embodiment mentioned above, since the position relationship between the electrode patterns 400a and 400e is same to that between the electrode patterns 400b and 400f neighboring with those, there are cases where the distance "$d_2$" shown in FIG. 4A comes to be short comparing to the distance "$d_1$". On the contrary to this, the third embodiment according to the present invention differs from, in particular, in an aspect that the distance between the electrode patterns neighboring with can be made longer than that according to other embodiments.

Figure 8:
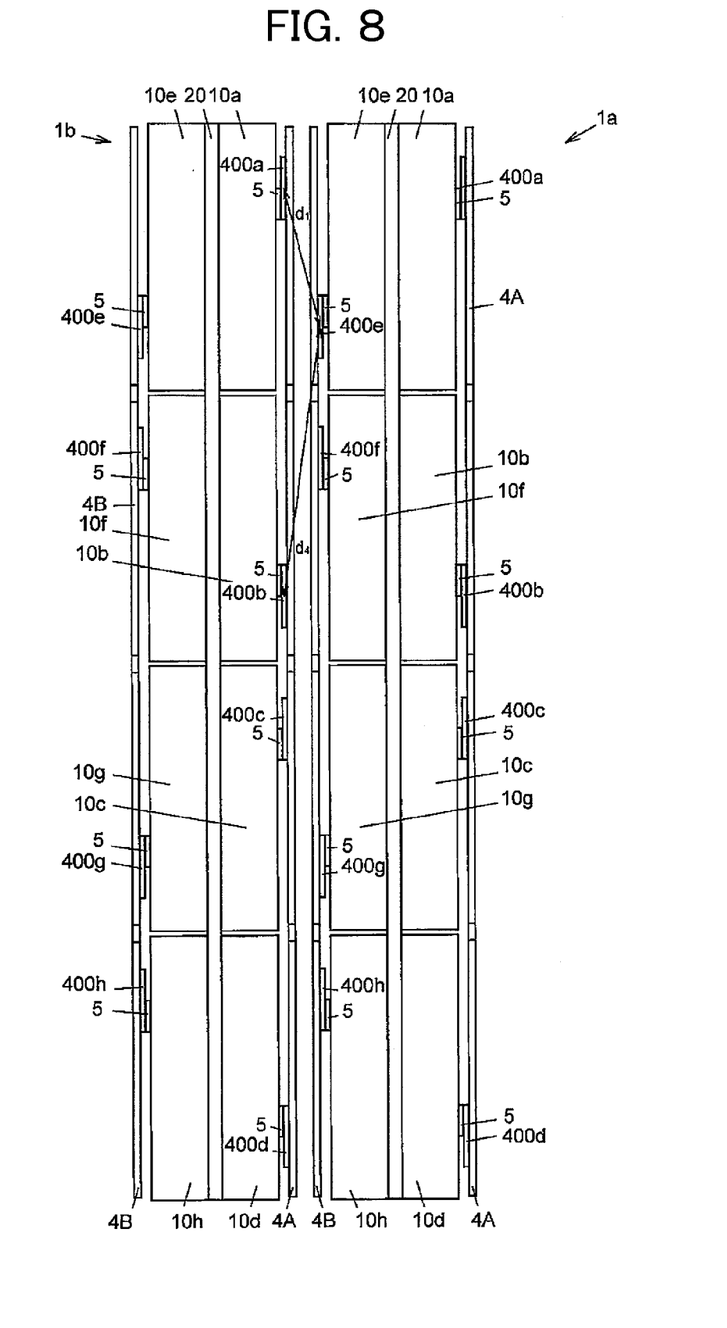
FIG. 8 is an enlarged upper view of the radioactive ray detectors according to the second embodiment of the present invention, in particular, when they are seen from an incident surface side of radioactive rays, under the condition of being disposed to align.

FIG. 8 is an enlarged upper view of the radioactive ray detectors according to the second embodiment of the present invention, in particular, when they are seen from an incident surface side of radioactive rays, under the condition of being disposed to align. As is shown in FIG. 8, with provision of the electrode pattern 400b at the position separating from the electrode pattern 400e, it is possible to make the distance "$d_4$" between the centers of the electrode patterns 400e and 400b longer than the distance "$d_1$".

Explanation will be given in more details thereof. By referring to FIGS. 2A and 2B, the electrode patterns 400a-400h, according to the first embodiment, are disposed within either one of regions with respect to the center line dividing each convex-like region, in the convex-like regions 40a-40h. In other words, in FIGS. 2A and 2B, all of those are formed shifting to the right side with respect to the center line dividing each convex-like region.

On the contrary to this, according to the third embodiment, on the flexible substrate 4A, in case where the electrode pattern 400a is disposed shifting to the right side respect to the center line dividing the convex-like region 40a, then the electrode pattern 400b is disposed shifting to the left side respect to the center line of the convex-like region 40b. And, the electrode pattern 400c is disposed to the right side with respect to the center line of the convex-like region 40c, and the electrode pattern 400d is disposed to the left side with respect to the center line of the convex-like region 40d.

Namely, the electrode patterns are disposed to the left and the right, alternately, with respect to the center line of the convex-like region. On the flexible substrate 4B, they are disposed in the similar manner. With using the flexible substrates 4A and 4B, forming the electrode patterns 400a-400h in such manner, it is possible to obtain the radioactive ray detector having the structure shown in FIG. 8. However, on the flexible substrate 4A and 4B according to the third embodiment may be formed the dummy patterns, further.

Effect(s) of Third Embodiment

With the radioactive ray detector, according to the third embodiment of the present invention, in case where the radioactive ray detectors are disposed to align, in addition to that of the case of the radioactive ray detector 1 according to the first embodiment (i.e., increasing of the distance "$d_1$" between the neighboring electrode patterns), it is also possible to increase the distance "$d_4$" between the electrode patterns neighboring with in an oblique direction. With this, it is possible to reduce the parasitic capacity generating between the electrode patterns, further.

In the above, although the explanation was given on the embodiments according to the present invention, but those embodiments described should not restrict the breadth of the invention described in the claims. Also, it should be noticed that all of the combinations of the features, which are explained in the embodiments, are essential to the means for dissolving the problem(s) of the invention.

EXPLANATION OF MARKS

1 . . . radioactive ray detector, 4A, 4B . . . flexible substrate, 5, 5a, 5e . . . conductive adhesive, 6 . . . radioactive rays, 10a-10h . . . CdTe element, 11a, 11e, 12a, 12e . . . element surface, 13a, 13e . . . second electrode, 14a, 14e . . . first electrode, 20 . . . substrate, 22a-22d . . . substrate terminal, 26 . . . electronic part mounting portion, 29 . . . card edge portion, 29a . . . edge wiring pattern, 30, 31 . . . cardholder, 32 . . . elastic member mounting portion, 32a . . . elastic member, 34 . . . hole with groove, 36a, 36b . . . projecting portion, 40a-40h . . . convex-like region, 41a-41h . . . connector portion, 42a-42c, 42f-42h . . . slit, 70 . . . supporting plate, 71 . . . connector, 72 . . . radioactive ray detector supporting body, 102a, 103a, 104a, 105a . . . corner region, 400a-400h . . . electrode pattern, 401a-401h . . . wiring pattern, 402a, 402e . . . front surface see-through image, 403a-403h . . . dummy pattern, 720 . . . wall portion, 721 . . . groove, 722 . . . recess portion, 723 . . . flat surface.

What is claimed is:

1. A radioactive ray detector, comprising:
   a substrate;
   a first semiconductor element and a second semiconductor element, which are provided to face to each other with positioning said substrate therebetween;
   a first electrode pattern, which is electrically connected with said first semiconductor element on a surface facing to an opposite side of said substrate; and
   a second electrode pattern, which is electrically connected with said second semiconductor element on a surface facing to an opposite side of said substrate,
   wherein
   said first electrode pattern and said second electrode pattern are arranged not to overlap with each other, when seeing through said substrate in a direction of thickness thereof.

2. The radioactive ray detector, as described in the claim 1, wherein
   said first electrode pattern is formed on a first wiring member,
   said first wiring member is fixed on said first semiconductor element through a conductive adhesive, which is put between said first electrode pattern and said first semiconductor element,
   said second electrode pattern is formed on a second wiring member, and
   said second wiring member is fixed on said second semiconductor element through a conductive adhesive, which is put between said second electrode pattern and said second semiconductor element.

3. The radioactive ray detector, as described in the claim 2, wherein
   said first electrode pattern is connected with one of corner regions of said first semiconductor element in a front surface view thereof, and
   said second electrode pattern is connected with said second semiconductor element in a corner region diagonally locating to said one corner region, with which said first electrode pattern is connected, when seeing through said substrate in a direction of thickness thereof.

4. The radioactive ray detector, as described in the claim 3, wherein
   a first dummy pattern is further formed on said first wiring member, not to overlap with said first electrode pattern,
   said first wiring member is fixed on said first semiconductor element through a conductive adhesive put between said first dummy pattern and said first semiconductor element,
   a second dummy pattern is further formed on said second wiring member, not to overlap with said second electrode pattern, and
   said second wiring member is fixed on said second semiconductor element through a conductive adhesive put between said second dummy pattern and said second semiconductor element.

5. The radioactive ray detector, as described in the claim 4, wherein
   said first dummy pattern is bonded on said first semiconductor element in the corner region diagonally locating to said one corner region, with which said first electrode pattern is connected, and
   said second dummy pattern is bonded on said second semiconductor element in the corner region diagonally locating to said corner region, with which said second electrode pattern is connected.

6. A radioactive ray detecting apparatus constructed by aligning plural numbers of radioactive ray detectors, wherein each of said radioactive ray detectors comprises:
   a substrate;
   a first semiconductor element and a second semiconductor element, which are provided to face to each other with positioning said substrate therebetween;
   a first electrode pattern, which is electrically connected with said first semiconductor element on a surface facing to an opposite side of said substrate; and a second electrode pattern, which is electrically connected with said second semiconductor element on a surface facing to an opposite side of said substrate, wherein said first electrode pattern and said second electrode pattern are arranged not to overlap with each other, when seeing through said substrate in a direction of thickness thereof.

7. The radioactive ray detecting apparatus, as described in the claim 6, wherein said first electrode pattern is formed on a first wiring member, said first wiring member is fixed on said first semiconductor element through a conductive adhesive, which is put between said first electrode pattern and said first semiconductor element, said second electrode pattern is formed on a second wiring member, and said second wiring member is fixed on said second semiconductor element through a conductive adhesive, which is put between said second electrode pattern and said second semiconductor element.

8. The radioactive ray detecting apparatus, as described in the claim 7, wherein said first electrode pattern is connected with one of corner regions of said first semiconductor element in a front surface view thereof, and said second electrode pattern is connected with said second semiconductor element in a corner region diagonally locating to said one corner region, with which said first electrode pattern is connected, when seeing through said substrate in a direction of thickness thereof.

9. The radioactive ray detecting apparatus, as described in the claim 8, wherein a first dummy pattern is further formed on said first wiring member, not to overlap with said first electrode pattern, said first wiring member is fixed on said first semiconductor element through a conductive adhesive put between said first dummy pattern and said first semiconductor element, a second dummy pattern is further formed on said second wiring member, not to overlap with said second electrode pattern, and said second wiring member is fixed on said second semiconductor element through a conductive adhesive put between said second dummy pattern and said second semiconductor element.

10. The radioactive ray detecting apparatus, as described in the claim 9, wherein said first dummy pattern is bonded on said first semiconductor element in the corner region diagonally locating to said one corner region, with which said first electrode pattern is connected, and said second dummy pattern is bonded on said second semiconductor element in the corner region diagonally locating to said corner region, with which said second electrode pattern is connected.

* * * * *